United States Patent
Prexl et al.

(10) Patent No.: US 6,861,901 B2
(45) Date of Patent: Mar. 1, 2005

(54) VOLTAGE FOLLOWER CIRCUIT

(75) Inventors: Franz Prexl, Niederding (DE);
Wolfgang Steinhagen, Mauern (DE);
Ralph Oberhuber,
Kumhausen/Landshut (DE)

(73) Assignee: Texas Instruments Deutschland, GmbH, Freising (DE)

( * ) Notice: Subject to any disclaimer, the term of this patent is extended or adjusted under 35 U.S.C. 154(b) by 0 days.

(21) Appl. No.: 10/459,860

(22) Filed: Jun. 12, 2003

(65) Prior Publication Data

US 2004/0104767 A1 Jun. 3, 2004

(30) Foreign Application Priority Data

Jul. 1, 2002 (DE) .......................................... 102 29 460

(51) Int. Cl.[7] .......................... H03K 5/153; H03K 9/02; G06G 7/12; H03D 1/00; H04L 27/06
(52) U.S. Cl. ....................... 329/347; 329/311; 329/353; 327/73; 327/562; 375/320; 375/340; 375/346
(58) Field of Search ................................. 329/311, 347, 329/349, 353; 327/73, 333, 560–562; 330/259, 260; 375/320, 340, 346

(56) References Cited

U.S. PATENT DOCUMENTS 4,714,845 A * 12/1987 Devecchi et al. ............. 327/73
5,847,606 A    12/1998 Shacter
6,005,439 A    12/1999 Fong

* cited by examiner

*Primary Examiner*—David Mis
(74) *Attorney, Agent, or Firm*—J. Dennis Moore; W. James Brady, III; Frederick J. Telecky, Jr.

(57) ABSTRACT

A voltage follower comprising a first field-effect transistor (MN1) whose gate forms the input of the voltage follower. Further provided is a second field-effect transistor (MN2) whose drain connected to the gate forms the output of the voltage follower. The sources of the two field-effect transistors (MN1, MN2) are connected to each other and to the drain of a third field-effect transistor (MN3) serving as current source and to the gate of which a predefined bias voltage is applied. The invention employs in addition a fourth field-effect transistor (MN4) whose source-drain path is circuited between the output of the voltage follower and the drain of the third field-effect transistor (MN3) and whose gate is connected to the gate of the third field-effect transistor (MN3). As compared to prior art voltage followers the voltage follower in accordance with the invention comprises a wider voltage range in which it can be put to use. This can be made use of e.g. in amplitude shift-keyed (ASK) demodulators incorporating the voltage follower in accordance with the invention and which need to be operated with particularly small supply voltages.

10 Claims, 4 Drawing Sheets

VOLTAGE FOLLOWER CIRCUIT

FIELD OF THE INVENTION

The invention relates to a voltage follower. In particular, the invention relates to a voltage follower used in an ASK demodulator for a remote sensing device such as a car passive entry system.

BACKGROUND OF THE INVENTION

Voltage followers are known from prior art, they also being termed impedance converters. Voltage followers are DC amplifiers employing negative feedback, designed so that the output voltage Ua follows the input voltage Ue. In making use of voltage followers the source furnishing the input voltage Ue is exclusively loaded by a very high input impedance of the voltage follower whilst the output voltage Ua of the amplifier originates from a source having a low output impedance, it being from this source that currents can then be obtained. The voltage follower does not alter the level of the input voltage, it instead facilitating further processing thereof by reducing the source impedance. Shown in FIG. 1a is a voltage follower known from prior art as described e.g. on page 327 of the German textbook "Elektronik" published by Heiner Herberg, Friedrich Vieweg & Sohn Verlagsgesellschaft mbH, Braunschweig/Wiesbaden, 2002.

The operational amplifier used in this prior art voltage follower may be e.g. an operational amplifier formed by MOSFETs as shown in FIG. 1b. In this arrangement the input voltage Ue is applied to the gate of a first NMOSFET MN1. The negative feedback is achieved by the drain of a second NMOSFET MN2 being connected to its gate which also forms the output of the voltage follower at which the output voltage Ua is available and which follows the input voltage Ue. The two NMOSFETs MN1 and MN2 are connected to each other by their sources, the connecting point of which is connected to ground via the source drain circuit of a third NMOSFET MN3. This third NMOSFET MN3 serves as a current source and is signaled by a bias voltage applied to its gate. In addition, 2 PMOSFETs MP1 and MP2 are provided in a current mirror configuration serving as the active loads of the operational amplifier and the source-drain circuit of which is connected to a supply voltage potential Vcc.

One disadvantage of the voltage follower as shown in FIG. 1b is that the output voltage Ua is no longer able to follow the input voltage Ue once the output voltage has assumed very low values, when, for instance, being below the threshold voltage Vt of a NMOSFET since the NMOSFET MN2 is then no longer conducting. This is particularly a disadvantage in circuits working with low supply voltages.

SUMMARY OF THE INVENTION

The invention is thus based on the objective of providing an improved voltage follower which, as compared to prior art, can now be put to use in a wider voltage range and whose output voltage follows the input voltage in a broad voltage range.

This objective is achieved by a voltage follower comprising a first field-effect transistor whose gate forms the input of the voltage follower, and a second field effect transistor whose drain connected to the gate forms the output of the voltage follower, whereby the sources of the two field-effect transistors are connected to each other and to the drain of a third field-effect transistor serving as current source and to the gate of which a predefined bias voltage is applied, and a fourth field-effect transistor whose source-drain path is circuited between the output of the voltage follower and the drain of the third field-effect transistor and whose gate is connected to the gate of the third field-effect transistor.

By the fourth field-effect transistor whose gate likewise receives the bias voltage the current flow to ground in the voltage follower as shown ie.g. in FIG. 2 is taken over when the output voltage drops below the threshold voltage Vt of the NMOSFET MN2 so that the output voltage of the voltage follower can now also follow the input voltage even at very low input voltages. Although the output voltage in this case fails to exactly follow the input voltage in this case, it is at least assured that the output voltage together with the input voltage can be dropped to ground which is sufficient for many applications.

Advantageous further embodiments of the invention are characterized in the sub-claims.

BRIEF DESCRIPTION OF THE DRAWINGS

The invention will now be detailed by way of example with reference to the drawing in which.

DETAILED DESCRIPTION OF THE PRESENT INVENTION

Figure 1A:
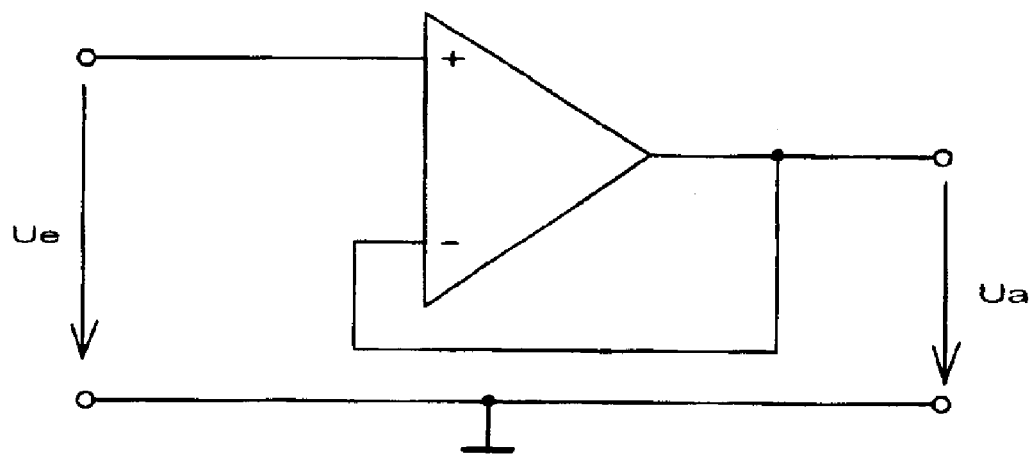
FIG. 1a is a circuit diagram of a prior art voltage follower.
Figure 1B:
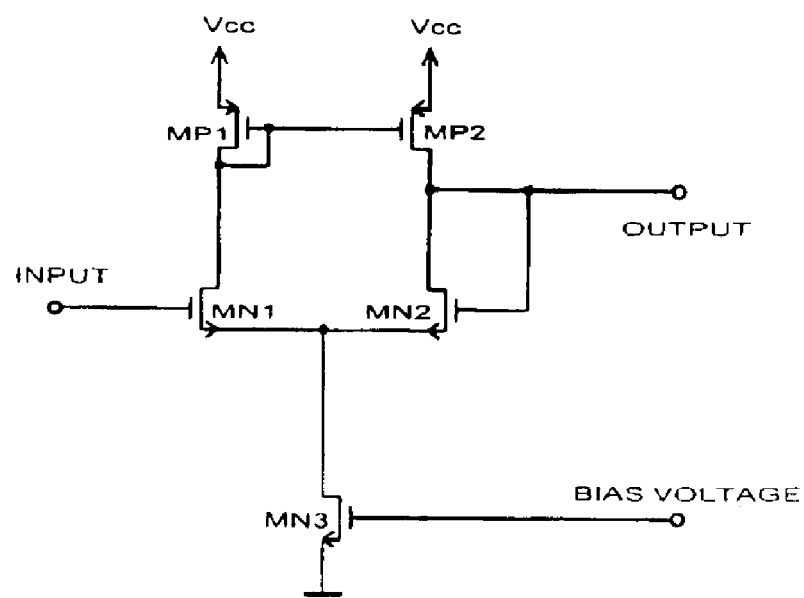
FIG. 1b is circuit diagram of a further prior art voltage follower incorporating an operational amplifier formed by MOSFETs.

The voltage follower in accordance with the invention differs only to a relatively minor extent from a conventional voltage follower as shown in FIG. 1b.

The voltage follower in accordance with the invention comprises a first NMOSFET MN1 whose gate is connected to the input voltage Ue of the voltage follower. Provided in addition is a second NMOSFET MN2 whose gate is connected to its drain to furnish the negative feedback of the amplifier basic to the voltage follower. The output signal Ua of the voltage follower is applied to the drain of the second NMOSFET MN2. The sources of the first field-effect transistor MN1 and second field-effect transistor MN2 are connected to ground via the source-drain path of a third NMOSFET MN3.

The third NMOSFET MN3 serves as a current source, to the gate of which a predefined bias voltage is applied which ensures that the third NMOSFET MN3 conducts a specific current of e.g. 10 nA.

In addition, a first PMOSFET MP1 is provided whose source is connected to a supply voltage potential Vcc and whose drain is connected to the drain of the first NMOSFET MN1.

The gate of the first PMOSFET MP1 is connected to the drain thereof. The gate of the first PMOSFET MP1 is additionally connected to the gate of a second PMOSFET MP2 which together with the the first PMOSFET MP1 forms a current mirror. The source of second PMOSFET MP2 is connected to the supply voltage potential Vcc whilst its drain is connected to the drain of second NMOSFET MN2. The PMOSFETs MP1 and MP2 form active loads for the source-drain circuits of the two NMOSFETs MN1 and MN2. Instead of the PMOSFETs MP1 and MP2 passive loads, i.e. impedances, may of course also be used.

In addition, a fourth NMOS field-effect transistor MN4 is provided whose source is connected to the drain of the third NMOSFET MN3 whereas its drain is connected to the gate of NMOSFET MN2. The gate of NMOSFET MN4 is connected to the bias voltage.

As NMOS field-effect transistors used in the voltage follower in accordance with the invention preference is given to types having a low threshold voltage (low Vt NMOS) to permit a low operating voltage (e.g. 1.8 V). In this arrangement the threshold voltage of the NMOS FETs may be e.g. of the order of approx. 400 mV achievable as known in prior art by tailored doping.

Figure 2:
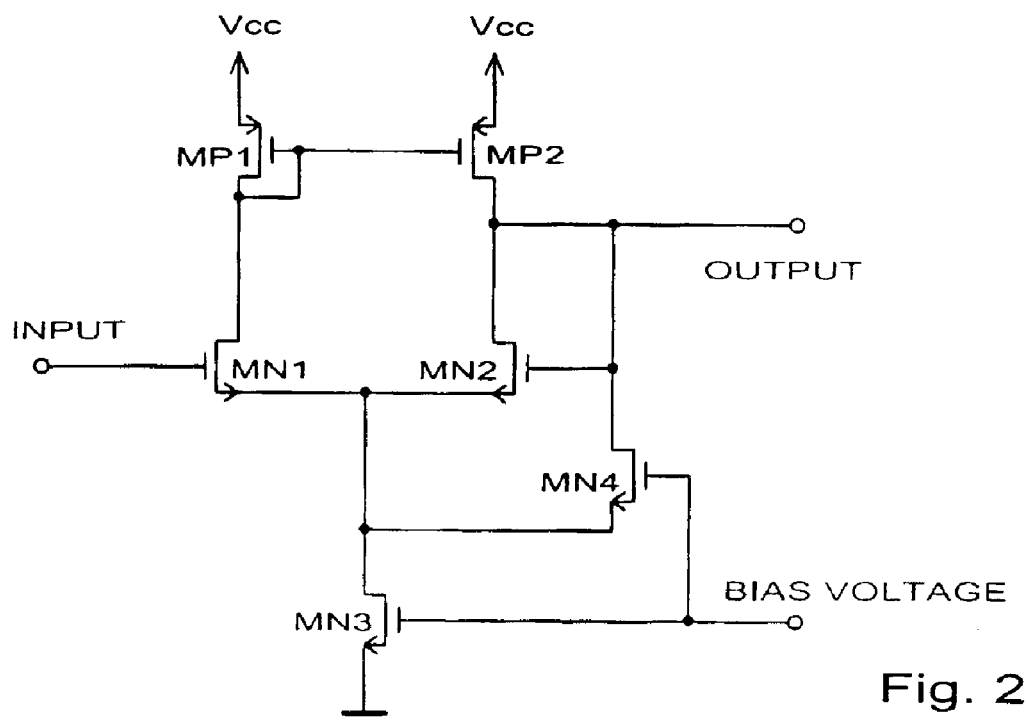
FIG. 2 is a circuit diagram of a first embodiment of a voltage follower in accordance with the invention.

Referring now to FIG. 2 there is illustrated the voltage follower, the function of which will now be detailed. Under normal conditions, i.e. when the voltage Ue applied to the input of the voltage follower is relatively high and exceeding the threshold voltage of an NMOSFET, the fourth NMOS-FET MN4 is non-conducting since the voltage at its source is below the level of the signal applied to the voltage follower by more than a threshold voltage (Vt). The bias voltage is set so that the level of the signal applied to the input of the voltage follower in this non-conducting is higher than the level of the bias voltage so that the fourth NMOS-FET MN4 is non-conducting.

A drop in the input voltage Ue applied to the input of the voltage follower prompts the output voltage Ua applied to the output of the voltage follower to attempt to follow the level of the input voltage Ue, the same in the prior art voltage follower as shown in FIG. 1b. This, however, can only function as long as the voltage Ua applied to the output of the voltage follower exceeds the threshold voltage Vt of a NMOSFET, since the second NMOSFET MN2 becomes non-conducting and thus can no longer draw current when the output voltage drops below this level. Before this condition is attained, however, the fourth NMOSFET MN4 is turned on and pulls the potential Ua applied to the output of the voltage follower down to ground potential via NMOS-FET MN3, resulting in nearly the same flow of current as before. The level of the output voltage Ua can thus be made to approach ground potential. The voltage follower in accordance with the invention thus comprises, as compared to that of the voltage follower as shown in FIG. 1b, a wider voltage range in which it can be put to use.

The bias voltage must be set so that the fourth NMOSFET MN4 is ON when the second NMOSFET MN2 is no longer conductive, because the input signal has dropped below a critical level substantially corresponding to the threshold voltage of a NMOSFET.

Figure 3:
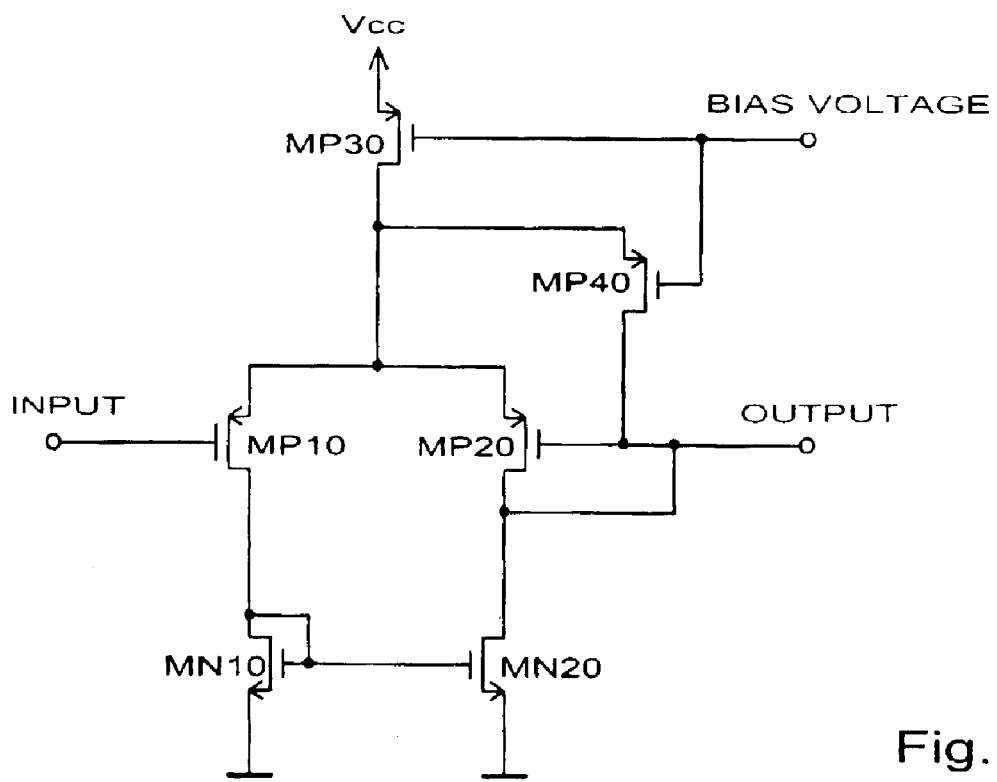
FIG. 3 is a circuit diagram of a second embodiment of a voltage follower in accordance with the invention.

Referring now to FIG. 3 there is illustrated a further embodiment of a voltage follower in accordance with the invention. In the embodiment as shown in FIG. 3 it is not the objective, however, to bring the output voltage as near as possible to ground as in the embodiment as shown in FIG. 2, but instead to bring the output voltage as near as possible to supply voltage potential Vcc. This is achieved via the additional PMOSFET MP40 whose source is connected to the drain of PMOSFET MP30 serving as the current source whilst its drain is connected to the output of the voltage follower. The gate of PMOSFET MP40 is connected to the bias voltage furnishing the bias for PMOSFET MP30. Otherwise the circuit is configured the same as the circuit shown in FIG. 2. In this arrangement the PMOS-FET MP10 functions as an input transistor whose gate is connected to the Ue whilst its source is connected to the drain of PMOS-FET MP30 and its drain via the load to ground. The further PMOS-FET MP20, whose gate is connected to the drain forming the output of the voltage follower, corresponds to the transistor MN2 as shown in FIG. 2. The drain of transistor MP20 is connected via a load to ground whilst its source is connected to the source of transistor MP10. The two NMOSFETs MN10 and MN20 are circuited in a current mirror configuration in forming in turn active loads. The function of the circuit as shown in FIG. 3 corresponds in principle to that of the circuit as shown in FIG. 2 except that in this case the output voltage Ua is corrected up to a voltage Vcc.

Figure 4:
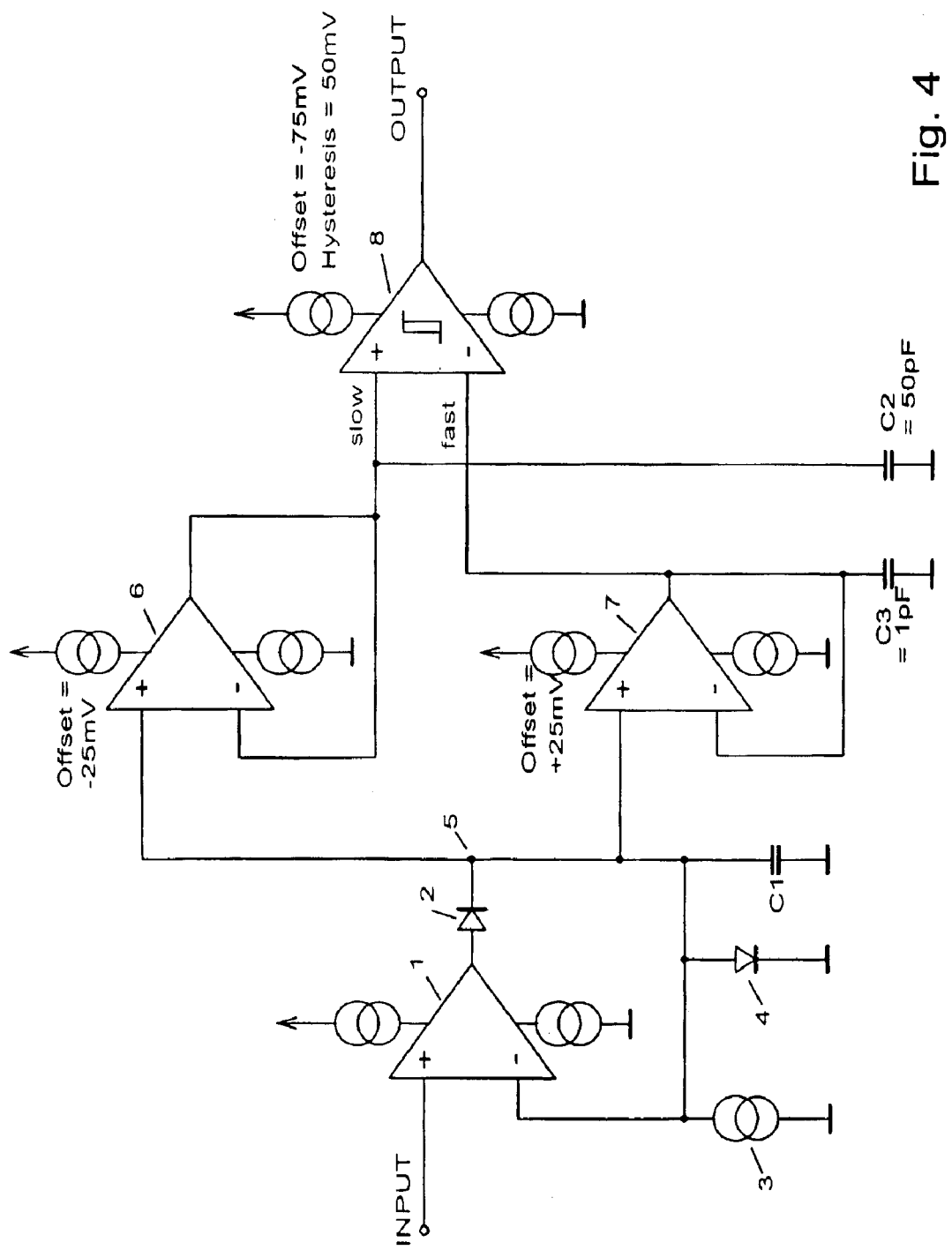
FIG. 4 is a circuit diagram of a demodulator employing a voltage follower in accordance with the invention.

Referring now to FIG. 4 there is illustrated an example application of the voltage follower in accordance with the invention as shown in FIG. 2. Shown in FIG. 4 is the circuit diagram of an amplitude shift-keyed (ASK) demodulator as may be used e.g. in a transponder receiving an ASK input signal which it converts at its output into a digitally demodulated signal.

The input of the demodulator as shown in FIG. 4 may be e.g. an AGC circuit which ensures that the voltage swing of the received modulated signal remains substantially constant.

Figure 5:
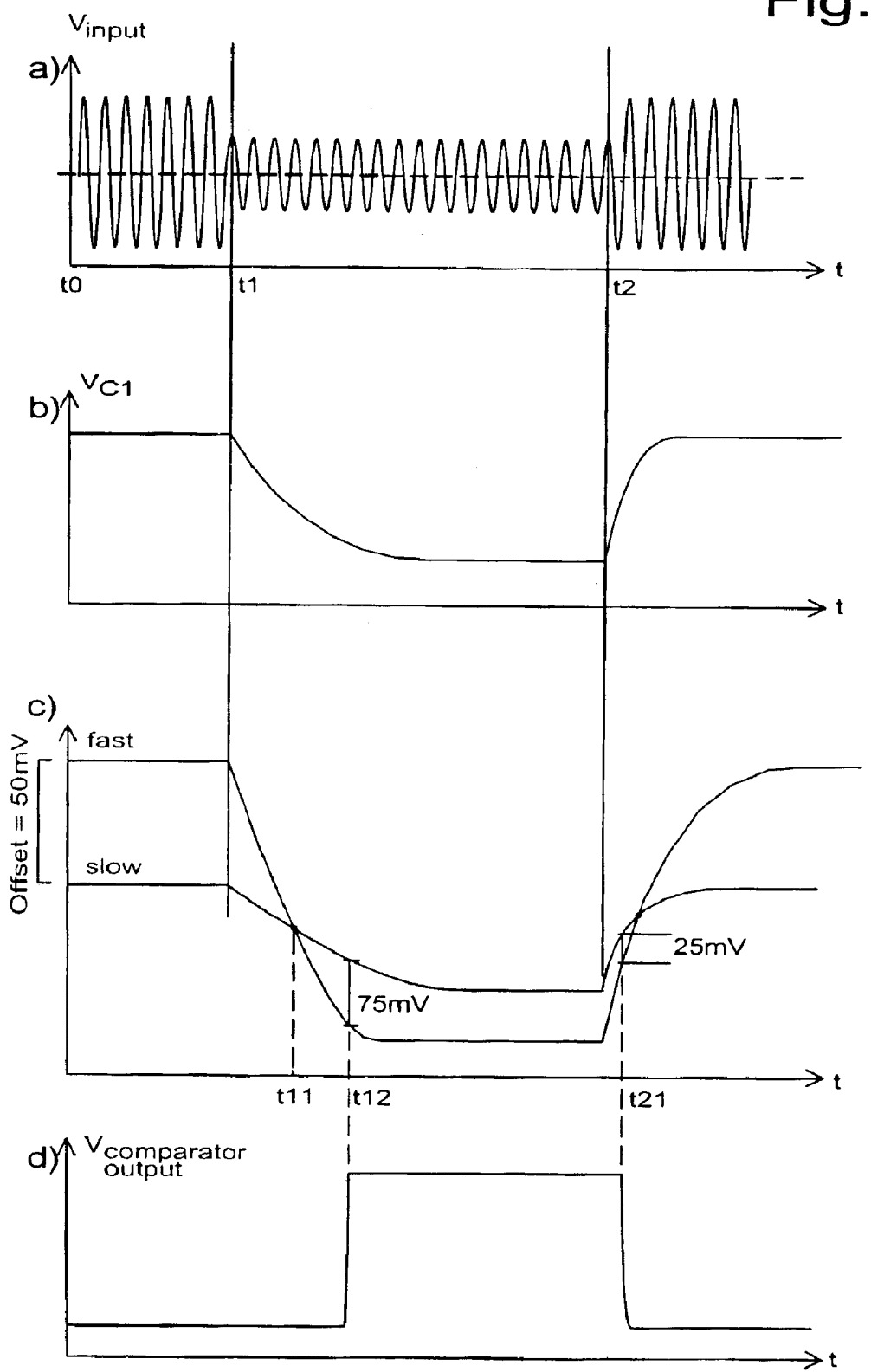
FIG. 5 are graphs depicting the signal profiles at the various circuit points of the demodulator as shown in FIG. 4.

Referring now to FIG. 5 there are illustrated various voltage signals as occurring at various points of the demodulator circuit as shown in FIG. 4 and serve for a better understanding of the circuit as shown in FIG. 4.

The demodulator as shown in FIG. 4 receives at its input ASK signals with which the amplitude of a carrier oscillation is switched between two states by a binary coded signal. The frequency of the carrier oscillation may be e.g. 134 kHz. FIG. 5a shows diagrammatically the signal received at the input of the demodulator. In this arrangement, the carrier oscillation of the input signal comprises up to point in time t1 a HI amplitude which at point in time t1 is switched to a LO voltage level representing e.g. the change in the digital state of the signal from 0 to 1. At point in time t2 the amplitude of the input signal is returned HI.

The signal applied to the input of the demodulator is directed via a voltage follower 1 and a detector diode 2 to a first capacitor C1 which is differingly charged and discharged as a function of the HI/LO state of the input signal. A current source 3 is provided, via which capacitor C1 is continually discharged with a defined current. The current source can be set e.g. to a current of 30 nA. By means of the rectifier assembly (1, 2, 3, 5, C1) frequencies exceeding the modulation bit rate are filtered out.

Although between the antenna of the transponder and the input of the demodulator circuit as shown in FIG. 4 a signal processing circuit is connected which ensures that the maximum voltage swing of the input signal remains substantially constant, heavy fluctuations in the voltage may materialize at the input since the signals received e.g. by a reader at the transponder input may exhibit heavily fluctuating voltage levels, resulting from the variation in the distance between reader and transponder. To minimize the transient response of the signal processing circuit connected to the input of the demodulator as shown in FIG. 4 a clamping diode 4 is provided which is connected to the capacitor C1 and has the task of ensuring that the output voltage of the detector appearing at circuit point 5 is clamped, i.e. unable to violate critical voltage values. An NMOSFET circuited as a diode may be used e.g. as clamping diode 4.

Referring now to FIG. 5b there is illustrated the detected voltage signal as it occurs at circuit point 5 and as applied to the capacitor C1. A HI to LO drop in the level of the ASK input signal at point in time t1 results in a drop in the voltage at capacitor C1 which is gradually discharged via the current source 3. As soon as the amplitude of the input signal increases again at point in time t2 capacitor C1 is recharged to its original level.

The signal applied to the circuit point 5 is connected to the input of a second voltage follower 6 and to the input of a third voltage follower 7. The output of the second voltage follower 6 is connected to a second capacitor C2 featuring a relatively large capacitance of 50 pF. The output of the third voltage follower 7 is connected to a third capacitor C3 having a relatively small capacitance of 1 pF which is smaller than the capacitance of the second capacitor C2.

Since the capacitance of the second capacitor C2 is substantially larger than the capacitance of the third capacitor C3 the second capacitor C2 driven by the second voltage follower 6 follows changes in voltage occurring at circuit point 5 substantially slower than the third capacitor C3 driven by the third voltage follower 7.

The output of the second voltage follower 6 is also connected to the first input of a comparator 8 whose other input is connected to the output of the third voltage follower 7.

To take into account the noise of the signal the comparator needs to be a comparator having sufficient hysteresis. This hysteresis may be e.g. 50 mV. In addition, an offset voltage of e.g. −75 mV exists between the inputs of the comparator. To further increase the offset between the "slow output signal" of the second voltage follower 6 and the "fast output signal" of the third voltage follower 7 each of the two voltage followers may comprise a further offset voltage which in the case of the second voltage follower may be, for instance, −25 mV and in the case of the third voltage follower may be +25 mV in supporting the comparator offset. With certain comparators it is not possible to attain an offset exceeding a critical maximum value, and thus necessarily so a certain proportion of the offset needs to be distributed to the two voltage followers 6 and 7 to achieve an adequate spacing in the output voltage (see FIG. 5c) between the "fast output signal" and the "slow output signal".

Referring now to FIG. 5c there are illustrated the voltages as applied to the inputs of the comparator 8. Therein the voltage applied to capacitor C3 is identified "fast" since this capacitor has a relatively small capacitance and can thus be charged/discharged relatively fast by the third voltage follower 7 and quickly follow changes in the level of the ASK input signal. The output signal applied to the second capacitor C2 is identified "slow" since this capacitor has a relatively large capacitance and can thus only be charged/discharged relatively slowly by the second voltage follower 6 and is slow in following changes in the level of the ASK input signal.

In addition, the offset of 50 mV of the two voltage followers is shown which ensures that the comparator 8 "sees" the signals at C3 and C2 so that between them at the point in time t0 a difference of 50 mV exists.

A drop in the voltage at capacitor C1 at point in time t1 results in a relatively quick drop in the voltage at the "fast" input of the comparator 8, which in potential is 50 mV higher the "slow" input, since capacitor C3 is discharged relatively quickly via the third voltage follower 7. Capacitor C2 and thus the voltage at the "slow" input of the comparator 8 drop only relatively slowly as evident from FIG. 5c. At some point in time (t11) the voltage at the "fast" input of the comparator 8 drops below the voltage at the "slow" input of the comparator, it not being until after a further time interval, at point in time t12, that due to the offset of the comparator of −75 mV the output signal applied to the output of the comparator 8 and thus of the demodulator switches from LO to HI.

In this arrangement a voltage follower in accordance with the invention is employed in FIG. 4 as the third voltage follower 7, as evident from e.g. FIG. 2. Such a voltage follower ensures that even with very small supply voltages which in the case of the present demodulator may be as low as 1.8 V, e.g. after the point in time t11 as shown in FIG. 5c, the voltage at capacitor C3 drops sufficiently below the voltage at capacitor C2 so that the comparator still continues to reliably switch. In addition, it also needs to be taken into account that temperature effects may exacerbate the situation, since the offset of the voltage follower increases with rising temperature whilst the input signal diminishes so that the "switching point" for this case is in even smaller values of the voltage of the "fast" signal. In other words, the important thing is not so much that the voltage applied to the output of the voltage follower 7 exactly follows the input voltage of the voltage follower, but that it comes near enough to ground potential so that the comparator can switch and the demodulator is thus able to correctly satisfy its function, namely to convert a modulated ASK signal at the input into a digital signal at the output. Preferably, use is made in this voltage follower of NMOSFETs having a particularly low threshold voltage (low Vt NMOS) to make the low output voltage possible.

The voltage follower in accordance with the invention as shown in FIG. 2 with its wider range for use of the voltage (as far as low levels are concerned) thus contributes towards achieving an ASK demodulator for reliable output even with very low supply voltages.

A repeat increase in the ASK signal applied to the input of the demodulator as regards the voltage level of its amplitude at point in time t2 results in fast charging of capacitor C3 and slow charging of capacitor C2. The comparator is then again switched (at point in time t21) when the voltage applied to the "fast" input of the comparator 8 has approached to within 25 mV of the voltage applied to the "slow" input of the comparator 8. This value of −25 mV materializes from the sum of the offset (−75 mV) of the comparator and of the hysteresis (50 mV).

It will, of course, be appreciated that the ASK demodulator as described is merely one example in the broad field of applications of the voltage follower in accordance with the invention. A wealth of other applications are conceivable, especially when the important thing is achieving circuits having low operating voltages.

What is claimed is:

1. A voltage follower comprising a first field-effect transistor (MN1) whose gate forms the input of said voltage follower, and a second field-effect transistor (MN2) whose drain connected to the gate forms the output of said voltage follower, whereby the sources of said two field-effect transistors (MN1, MN2) are connected to each other and to the drain of a third field-effect transistor (MN3) serving as current source and to the gate of which a predefined bias voltage is applied, and a fourth field-effect transistor (MN4) whose source-drain path is circuited between the output of said voltage follower and the drain of said third field-effect transistor (MN3) and whose gate is connected to the gate of said third field-effect transistor (MN3).

2. The voltage follower as set forth in claim 1 wherein the source of said third field-effect transistor (MN3) is connected to ground and the drains of said first and second field-effect transistors (MN1, MN2) are connected to a supply voltage potential (Vcc) via loads.

3. The voltage follower as set forth in claim 1 wherein the source of said third field-effect transistor (MP30) is connected to a supply voltage potential (Vcc) and the drains of said first field-effect transistor (MP10) and said second field-effect transistor (MP20) are connected to ground potential via loads (MN10, MN20).

4. The voltage follower as set forth in claim 3 wherein said loads are active loads (MP1, MP2; MN10, MN20) with current mirrors.

5. The voltage follower as set forth in claim 4 wherein the field-effect transistors (MN1, MN2, MN3, MN4, MP1, MP2; MP10, MP20, MP30, MP40; MN10, MN20) are MOSFETs.

6. A ASK demodulator circuit having a voltage follower comprising:

a first field-effect transistor (MN1) whose gate forms the input of said voltage follower, and a second field-effect transistor (MN2) whose drain connected to the gate forms the output of said voltage follower, whereby the sources of said two field-effect transistors (MN1, MN2) are connected to each other and to the drain of a third field-effect transistor (MN3) serving as current source and to the gate of which a predefined bias voltage is applied, and a fourth field-effect transistor (MN4) whose source-drain path is circuited between the output of said voltage follower and the drain of said third field-effect transistor (MN3) and whose gate is connected to the gate of said third field-effect transistor (MN3).

7. The ASK demodulator as set forth in claim 6 further comprising a rectifier (2, C1) whose output (5) is connected to a first voltage follower (6) whose output is connected to a first capacitor (C2) and connected to a second voltage follower (7) configured as set forth in any of the claims 1 to 5 and whose output is connected to a second capacitor (3) whose capacitance is smaller than the capacitance of said first capacitor (C2), said first capacitor (C2) being connected to the one input and said second capacitor (3) being connected to the other input of a comparator (8).

8. The ASK demodulator as set forth in claim 7 wherein said two voltage followers (6, 7) each comprise opposing offset voltages.

9. The ASK demodulator as set forth in claim 8 wherein said comparator (8) comprises an offset voltage.

10. The ASK demodulator as set forth in claim 9 wherein said comparator (8) is a comparator including hysteresis.

* * * * *